United States Patent
Ferri et al.

(10) Patent No.: US 9,123,483 B2
(45) Date of Patent: Sep. 1, 2015

(54) WATERPROOF WATCH PUSHBUTTON

(71) Applicant: The Swatch Group Research and Development Ltd., Marin (CH)

(72) Inventors: Yvan Ferri, Lausanne (CH); Sergio Rota, Colombier (CH); Jean-Claude Martin, Montmollin (CH)

(73) Assignee: The Swatch Group Research and Development Ltd., Marin (CH)

( * ) Notice: Subject to any disclaimer, the term of this patent is extended or adjusted under 35 U.S.C. 154(b) by 0 days.

(21) Appl. No.: 13/722,140

(22) Filed: Dec. 20, 2012

(65) Prior Publication Data

US 2013/0163395 A1  Jun. 27, 2013

(30) Foreign Application Priority Data

Dec. 22, 2011 (EP) .................................... 11195404

(51) Int. Cl.
| | | |
|---|---|---|
| *G04B 37/00* | (2006.01) | |
| *G04B 29/00* | (2006.01) | |
| *H03K 17/975* | (2006.01) | |
| *H01H 13/06* | (2006.01) | |
| *G04B 37/10* | (2006.01) | |
| *G04B 3/04* | (2006.01) | |
| *G04G 17/00* | (2013.01) | |

(Continued)

(52) U.S. Cl.
CPC .............. *H01H 13/06* (2013.01); *G04B 3/046* (2013.01); *G04B 3/048* (2013.01); *G04B 37/106* (2013.01); *G04C 3/001* (2013.01); *G04G 17/00* (2013.01); *H03K 17/962* (2013.01); *H03K 17/975* (2013.01)

(58) Field of Classification Search
CPC ........ G04B 3/001; G04B 3/046; G04B 3/048; G04B 37/106

USPC ........... 368/288–291, 308, 319–321; 200/600
See application file for complete search history.

(56) References Cited

U.S. PATENT DOCUMENTS 2,262,777 A * 11/1941 Roper ........................... 200/406
4,259,551 A * 3/1981 Ohtani et al. ................. 368/278

(Continued)

FOREIGN PATENT DOCUMENTS

| EP | 0 838 737 A1 | 4/1998 |
| FR | 2 327 623 | 5/1977 |

OTHER PUBLICATIONS

European Search Report issued Aug. 28, 2012 in corresponding European Application No. 11 19 5404 filed Dec. 22, 2011 (with an English Translation).

*Primary Examiner* — Amy Cohen Johnson
*Assistant Examiner* — Daniel Wicklund
(74) *Attorney, Agent, or Firm* — Oblon, McClelland, Maier & Neustadt, L.L.P.

(57) ABSTRACT

A sealed pushbutton for a wristwatch includes a pushbutton head that is movable between a resting position and an active position, a first fixed conductive element, a second movable conductive element, and an elastically deformable capsule. The elastically deformable capsule hermetically covers the first fixed conductor, and an upper surface of the capsule is in physical contact with a lower surface of the pushbutton head and the capsule is locatable in a non-deformed position when the pushbutton head is in its resting position and in a deformed position when the pushbutton head is in its active position. The first and second conductive elements form a capacitive or resistive switch device, and the switch is in open state when the pushbutton head is in its resting position and in closed state when the pushbutton head is in its active position.

15 Claims, 5 Drawing Sheets

(51) Int. Cl.
*G04C 3/00* (2006.01)
*H03K 17/96* (2006.01)

(56) References Cited

U.S. PATENT DOCUMENTS

| | | | |
|---|---|---|---|
| 4,287,400 A * | 9/1981 | Kitik et al. | 368/289 |
| 4,965,415 A * | 10/1990 | Young et al. | 200/83 N |
| 5,479,042 A * | 12/1995 | James et al. | 257/415 |
| 6,137,750 A * | 10/2000 | Rieben | 368/290 |
| 6,184,871 B1 * | 2/2001 | Teres et al. | 345/173 |
| 7,763,819 B2 * | 7/2010 | Ieda et al. | 200/600 |
| 2005/0073806 A1 * | 4/2005 | Oesch et al. | 361/679 |
| 2008/0067050 A1 * | 3/2008 | Ieda et al. | 200/512 |
| 2012/0043191 A1 * | 2/2012 | Kessler et al. | 200/5 A |
| 2012/0092288 A1 * | 4/2012 | Wadia | 345/174 |
| 2012/0228111 A1 * | 9/2012 | Peterson et al. | 200/600 |

* cited by examiner

WATERPROOF WATCH PUSHBUTTON

This application claims priority from European Patent Application No. 11195404.6 filed Dec. 22, 2011, the entire disclosure of which is incorporated herein by reference.

FIELD OF INVENTION

The present invention relates to a waterproof pushbutton for a wristwatch and more specifically to a sealed pushbutton for an electronic watch comprising a capacitive or resistive switch device.

BACKGROUND OF THE INVENTION

Classic mechanical pushbuttons generally comprise a transverse head in relation to the centrepart of a watch case, of which a lower end comes to rest against a movable or plastically deformable element such as a blade of an operating device, for example. When the pushbutton is pressed in, the end of this transverse head causes the movable element to move, and this comes into abutment to activate a mechanical or electronic function. Moreover, the coming into abutment enables the user to have a mechanical confirmation of the actual activation of the desired function by the pushbutton. However, this solution poses problems of sealing in relation to the interior of the case. In fact, the seal is only guaranteed when resting, but never completely upon activation under water because of the friction exerted on the joints, typically the O rings, past a relatively shallow depth. Moreover, compression of the joints greatly increases the force threshold to be applied to press in the pushbutton, which makes use relatively inconvenient.

Capacitive operating devices are, moreover, known that are used as proximity switches, for example, for touch screens or digital photographic devices. This type of device can certainly allow physical isolation of the interior of a case in theory, since it does not require a transverse element similar to the usual solution for watch pushbuttons, but it still has the disadvantage of automatically detecting a variation in electrical capacitance on contact with water, which makes it unsuitable for use when immersed where it would no longer be possible to dissociate the actual activation by the user from that caused merely by contact with water. Moreover, the adaptation of such a device to the dimensions of a wristwatch poses substantial problems in terms of detection thresholds, since the capacitance depends, amongst other factors, on a relation between the surface of the armatures and their spacing, which becomes difficult to manage when the contact surfaces are considerably reduced and, above all, when the minimum spacing between the armatures is relatively large, which is the case when the conductive elements of the capacitance used for the detection are arranged on either side of a hermetic insulating plate.

Moreover, resistive operating devices are also known, for example, for computer keyboards, wherein pressing a key to abut against a conductive surface allows an electric circuit to be closed and an electronic function to be activated. A pushbutton is also known from document U.S. Pat. No. 2,262,777 that forms a resistive electric switch intended to be integrated into an aircraft joystick, for example. Pressure on the pushbutton allows a capsule to be deformed, under which a movable conductive element is riveted that can be brought into contact with a fixed conductive element arranged in the body of the pushbutton. However, such devices are likewise unsuitable for use under water because of their lack of seal, nor can they be replicated for a wristwatch because of the high consumption of electric power necessary for permanent charging of the detection circuit, which would have a very negative impact on the service life of the battery.

In the field of watchmaking, a pushbutton coupled to an electrical switch is known from document FR 2327623 that comprises star-shaped conductive elastic elements, the deformation of which allows a circuit to be closed and which in parallel exert a restoring force to return to their resting position. However, the seal of the pushbutton is only assured by O ring-type seals in accordance with classic mechanical pushbuttons with the same disadvantages of reliability in terms of hermetic seal for activation when immersed and of the minimum force threshold to be applied because of the deformation of the joint.

There is therefore a need for a sealed pushbutton for wristwatches without the known limitations.

SUMMARY OF THE INVENTION

These aims are achieved in particular on the basis of a sealed pushbutton according to the main claim with advantageous embodiments given in the dependent claims. The sealed pushbutton comprises a pushbutton head that is movable between a resting position and an active position, and first fixed conductive element and a second movable conductive element. It is characterised in that it comprises an elastically deformable capsule that hermetically covers the first fixed conductor, wherein an upper surface of the capsule is in physical contact with a lower surface of the pushbutton head and the capsule can be located in a non-deformed position when the pushbutton head is in its resting position and in a deformed position when the pushbutton head is in its active position. The first and second conductive elements form a capacitive or resistive switch device, wherein the switch is in open state when the pushbutton head is in its resting position and in closed state when the pushbutton head is in its active position.

An advantage of the proposed solution is to enable the seal to be guaranteed in relation to the interior of the watch case, in contrast to the usual solutions of completely mechanical pushbuttons, and also to minimise the travel required for the pushbutton head, which must be relatively long for usual wristwatches in order to compensate all tolerance errors of placement of different pieces and thus guarantee an effective activation by mechanical engagement each time the pushbutton head is pressed in.

Another advantage of the proposed solution is to guarantee reliability of engagement under water for a dive watch, for example, solely after the pushbutton has been pressed without being disturbed by automatic detection of the presence of the water when immersed in contrast to a classic capacitive solution that would no longer be able to detect the actual pressing of the pushbutton.

An additional advantage of the proposed solution is to provide, according to a preferred embodiment, a "click effect", i.e. a mechanical feedback to the user of activation of the desired function on the basis of the elastic deformation of a capsule used to seal the device in relation to the exterior of the centrepart. As soon as the curvature of this capsule is inverted, the user will know that the function has been activated, irrespective of whether this has come into contact with an abutment surface or not, in particular for a capacitive mode of detection.

BRIEF DESCRIPTION OF THE DRAWINGS

Other characteristics and advantages will become clearer from the detailed description of various preferred embodiments and the attached drawings, wherein.

DETAILED DESCRIPTION OF THE PREFERRED EMBODIMENTS

Figure 1A:
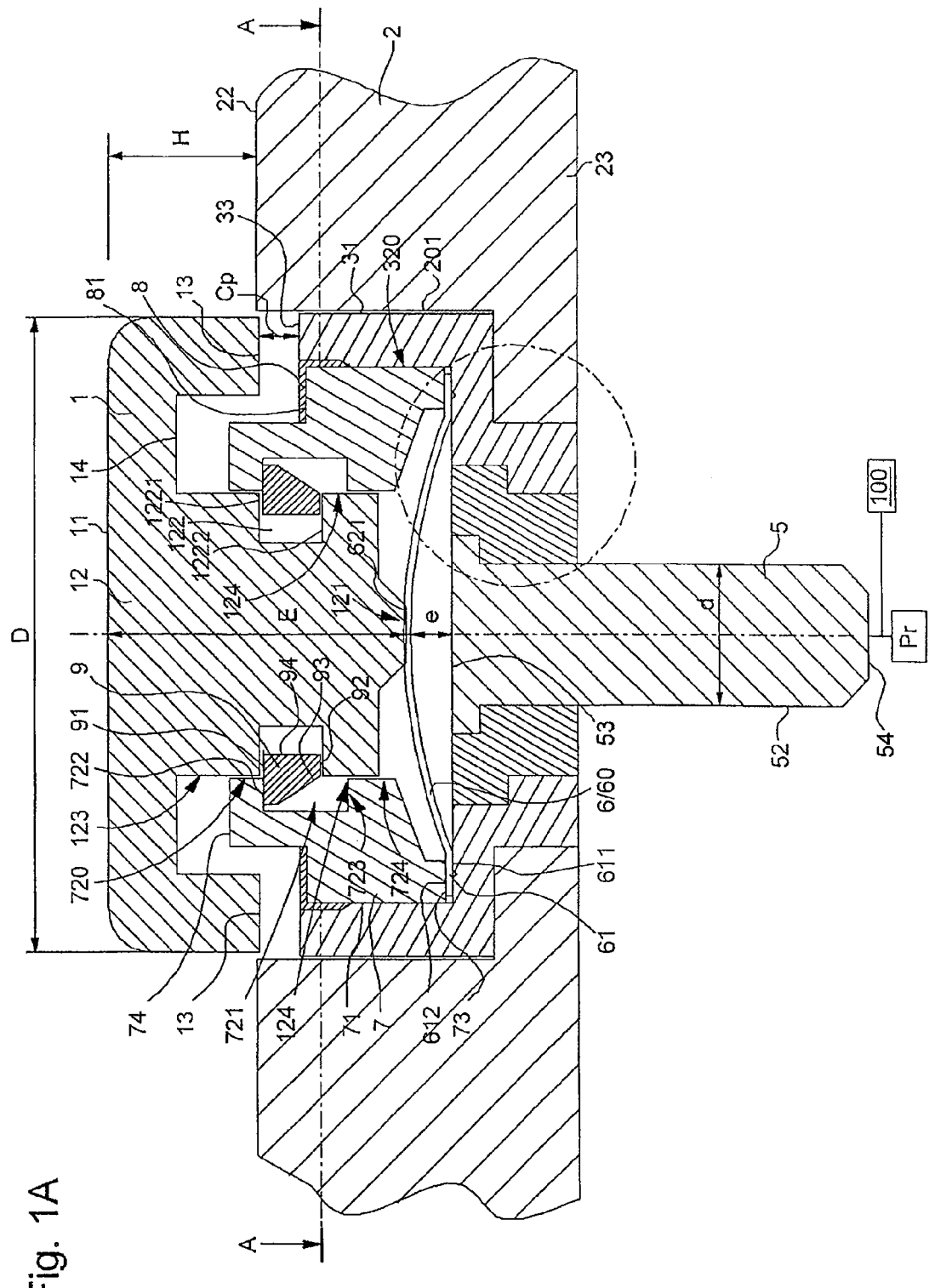
FIG. 1A is a sectional view of a pushbutton according to a preferred embodiment of the invention when resting.
Figure 1B:
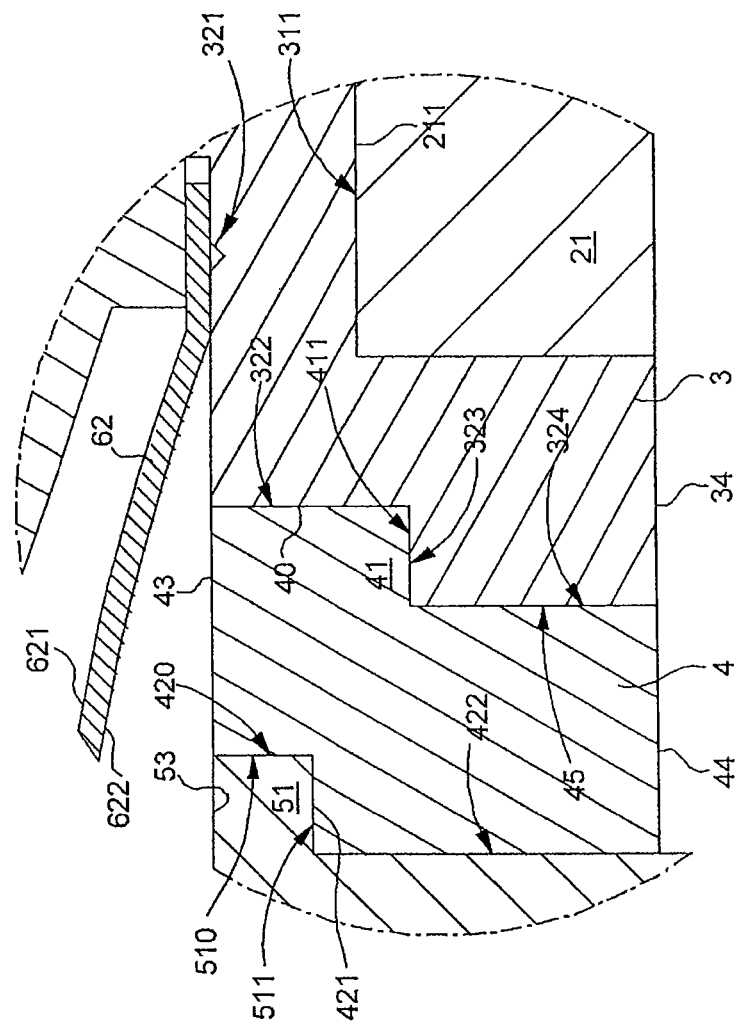
FIG. 1B shows an enlargement of FIG. 1A in the area of the assembly of the pushbutton body, the sealed piece, the insulating piece and the first fixed conductive element.
Figure 1C:
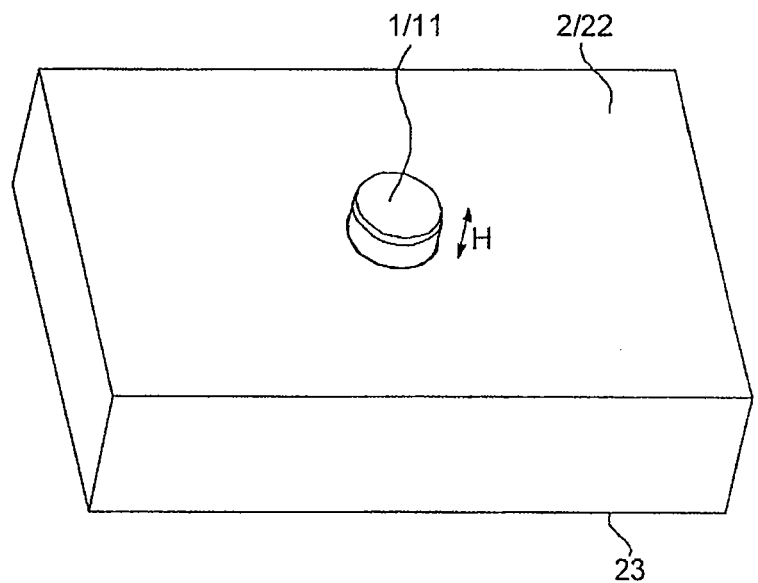
FIG. 1C is a perspective view of a pushbutton according to the preferred embodiment of FIG. 1A in assembled mode in the centrepart and when resting.
Figure 1D:
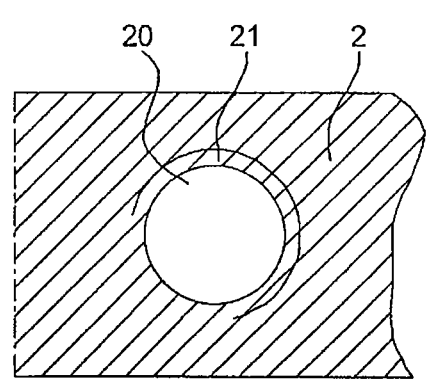
FIG. 1D is a sectional view taken along axis A-A of the blind hole arranged in the centrepart to receive the preferred embodiment of the pushbutton according to the invention of the previous FIGS. 1A and 1B.

The following FIGS. 1A, 1B and 1C show two different views respectively in section and in plan view of a pushbutton according to a preferred embodiment of the invention, in which the pushbutton head 1 projects slightly out of the centrepart 2 of the watch when the pushbutton is in the resting position Pr. According to this preferred embodiment the pushbutton can be assembled in modular fashion outside the centrepart 2 before being inserted into a through hole 20 of the centrepart 2 illustrated in FIG. 1D. FIG. 1B is simply an enlargement of FIG. 1A in the area of the assembly of different parts. Since this FIG. 1B was introduced for reasons of legibility in order to add thereto references relating to the different pieces illustrated, these two figures will be referred to in combination in the following for specification of the references of the pieces described in the description.

As can be seen from the sectional view in FIG. 1A, the pushbutton head 1 comprises an upper substantially plane surface 11, against which one of the fingers of the user is supposed to come into contact to press in the pushbutton and activate a predetermined function such as starting a chronometer, setting an alarm etc., and which is raised in relation to the outer surface 22 of the centrepart 2 by a height H of preferably less than or equal to 2 millimetres, as illustrated in FIG. 1C. This height H allows a slight projection outside the centrepart 2 and thus allows a better grip for the user, but without this projection interfering with wearing comfort because of additional space requirement as well as the more prominent edges that are formed and can come into contact with the skin.

According to an illustrated preferred embodiment, the pushbutton head 1 comprises a lower peripheral annular abutment surface 13 intended to come into contact with a likewise annular outer surface 33 of a pushbutton body 3, in which all the pieces of the pushbutton are assembled. The inner peripheral abutment surface 13 is aligned at the level of the outer surface 22 of the centrepart 2 so that the height H is also equal to the thickness of the pushbutton in its peripheral part, i.e. the height difference between the upper surface 11 of the pushbutton head 1 and the lower peripheral abutment surface 13, as illustrated in FIG. 1A.

The upper surface 11 of the pushbutton head is a disc with a diameter D preferably in the range of between 4 and 5 millimetres to enable the user to get a good grip. These dimensions are equivalent to those of a traditional mechanical pushbutton, but pose constraints in terms of surfaces to form armatures of a capacitor as part of a capacitive embodiment, for which the order of magnitude for the size of the armatures is about 10-times larger, as for the keys or buttons of photographic devices, for example, that have outer gripping surfaces in the order of 1 square centimeter. In fact, the value of the capacitance of a plane capacitor is directly proportional to the size of the surfaces facing one another. These surface areas are consequently very reduced in the framework of the invention, which means that the spacing between them must be reduced when an activation has to be detected, or that the geometric form of the armatures must be adapted, as explained below.

The pushbutton head 1 comprises a central part 12 guided axially to perform a translation movement towards the interior of the centrepart 2 by a guide piece 7, of which the first and second inner side faces 720 and 724 respectively cooperate with the first outer side face 123 and the second outer side face 124 respectively. A lower face 121 of the central part 12 of the pushbutton head is in contact with an upper face 621 of the deformable central part 62 of the capsule, and any translation movement of the head of the pushbutton 1 towards the interior will tend to deform the capsule 60 to bring it closer to the first fixed contact element 5 of the switch device of the invention in contact with an electronic detection circuit 100. According to a preferred embodiment the pushbutton head 1 is made from insulating material such as plastic, for example, and the thickness of the central part E is preferably chosen to be more than or equal to 3 millimetres in order to better electrically insulate the movable conductive element 6 arranged at the level of the capsule 60 from the exterior of the centrepart 2, e.g. for a use in water or to prevent any parasitic capacitance effect when a finger is simply placed on the upper surface 11 of the pushbutton head 1 when the pushbutton head is in its resting position Pr.

According to the preferred embodiment illustrated in FIGS. 1 and 1B, the capsule 60 is hermetically secured above the first fixed conductor 5 at its annular peripheral part 61 glued or welded to the pushbutton body 3 at its lower surface 611 and covered at the level of the upper surface 612 of this same peripheral part 61 by a lower surface 73 of the guide piece 7 that is pressed into the pushbutton body 3. Because the guide piece 7 is pressed in at the peripheral part 61 of the capsule 60, the seal of the pushbutton can be improved by preventing any water from seeping through the outside of the capsule 60. According to a variant the capsule no longer has a collar, i.e. an annular peripheral part 612, and the seal is assured by a silicone adhesive joint arranged on its upper surface 612. The capsule is preferably metallic and is consequently fully conductive such that it alone forms the second conductive element 6 without requiring the addition of a conductive element by gluing or welding on the lower 622 or upper 621 surface of its plastically deformable central part 62. To prevent any corrosion of the capsule 60, the central part 62 of which will be brought regularly into contact with water, a non-oxidising material such as aluminium could be chosen or the capsule 60 could be covered with a laminated plastic sheet.

When the capsule 60 is metallic, a metal material will preferably also be chosen for the pushbutton body 3 in order to improve the sensitivity of the capacitor, the outer armature of which is formed by the conductive capsule 60 and the pushbutton body 3, and the inner armature of which is formed by the first fixed conductive element 5, arranged here as a transverse piece in relation to the centrepart 2. This arrangement provides a mixed structure between a plane capacitor and a cylindrical capacitor because of the dielectric formed by the annular insulating piece 4 interposed between the first conductive element 5 and the pushbutton body 3, which increases the capacitance of the capacitor formed significantly in relation to a capacitor that only has a first armature formed by the central part 62 of the capsule 60 and the upper surface 53 of the conductive piece. In fact, according to the described preferred embodiment this upper surface 53 is only equal to about 1 square millimeter at maximum to be able to accommodate the pushbutton body 3 and the insulating piece 4. According to the preferred embodiment illustrated in FIGS. 1A and 1B, the diameter d of the first fixed conductive element 5 between its side faces 52 is equal to about 1 millimeter and the shoulder 51 provided for its assembly allows the upper surface 53 thereof facing the second conductive element to be increased slightly.

As indicated above, the described preferred variant of the pushbutton can be mounted in modular fashion in the pushbutton body 3 outside the centrepart 2, then forcibly pressed into the through hole 20 illustrated in FIG. 1 D, which corresponds to a sectional view taken along axis A-A of FIGS. 1A and 1B. This through hole 20 corresponds to a shoulder 21 also visible in FIG. 1A, on which an abutment surface 211 is arranged and against which the abutment surface 311 of the pushbutton body is brought into contact, whereas the outer side face of the pushbutton 31 is preferably held by friction in the through hole along its side walls 201. It is also conceivable to fix the pushbutton body by gluing or welding the above-mentioned walls onto one another (references 201, 211 in FIG. 1A), or also to arrange a joint along the side wall 201 of the through hole 20 in order to improve the seal of the assembly.

To facilitate the assembly operations, not only the orifice provided in the centrepart 2 but also the first contact element 5 and the insulating piece 4 can have shoulders to fit into one another, as illustrated in FIG. 1B. The shoulder 51 of the first conductive element 5 has a first lower abutment surface 511 brought into contact with a second abutment surface 421 of the insulating piece 4, while the outer side face of the shoulder 510 is brought into contact with the first inner lateral assembly surface 420 and the side face of the first conductive element 52 is in contact with the second inner lateral assembly surface 422 of the insulating piece. Similarly, the insulating piece 4 comprises a shoulder 41 comprising an outer side face 410 that is brought into contact with a second inner assembly surface 322 of the pushbutton body—the first inner assembly surface 320 of the pushbutton body being provided for assembly of the guide piece 7—and a first lower abutment surface 411 brought into contact with a third abutment surface 323 of the pushbutton body 3—the first and second abutment surfaces 311 and 321 respectively being provided for assembly on the shoulder 21 of the through hole 20 and the assembly of the peripheral part 61 of the capsule 60. The side face of the insulating element 45 is in contact with the third inner lateral assembly surface 324 of the pushbutton body 3. As a result of these different shoulders visible in FIG. 1A and in more detail in FIG. 1B, the relative axial positioning of the different pieces (i.e. the first conductive element 5, the insulating piece 4 and the pushbutton body 3 in relation to the interior of the centrepart 2) is easy, as is the assembly by forcibly pressing along the different assembly surfaces. Although the assembly surfaces between these different pieces are vertical, slightly oblique surfaces would be conceivable to facilitate the operation of assembling by friction. As can be seen from FIGS. 1A and 1B, the upper surface of the first conductive element 53, the upper surface of the insulating element 43 and the second abutment surface of the pushbutton body 321 align at the same horizontal level. This horizontal alignment allows efficient management of the spacing e between the first fixed conductive element 5 and the second movable conductive element 6, which determines the nominal capacitance of the capacitor formed between these two conductors simply as a function of the curvature of the capsule 60, i.e. the vertical distance between the top of the capsule in contact with the first lower surface 121 of the central part 12 of the pushbutton head 1 and the peripheral part 61. Similarly, the lower surface of the pushbutton body 34 align at the same horizontal level as the inner surface of the insulating piece 44 and that the inner surface of the centrepart 23, whereas the inner surface of the first conductive element 54 is located more towards the interior of the centrepart 2 to then be connected towards the detection circuit 100, thus requiring the least amount of cabling possible. However, it is conceivable that the lower surface of the first conductive element 54 align at the same horizontal level as the lower surface of the insulating piece 44 and the other lower surfaces mentioned above.

According to the illustrated preferred embodiment, the first cylindrical conductive element 5 with a shoulder 51 at the level of its upper surface 53 can be fitted into the insulating piece 4, which has an annular shape and also has a shoulder 41 at the level of its upper surface 43 for fitting into the pushbutton body 3. Once these three pieces are assembled, the assembly of the capsule 60 into the pushbutton body 3 can proceed through the lower surface 611 of the peripheral part 61 on the second abutment surface 321 of the pushbutton body 3. The guide piece 7 can then be assembled along the first inner assembly surface 320 of the pushbutton body 3 on the upper surface 612 of the peripheral part 61 of the capsule 60. The inner assembly surface 320 of the pushbutton body cooperates with the outer assembly surface 71 of the holding piece 71. To improve the fixture of the guide piece 7 in the pushbutton body 3, a fastening ring 8 could be used that is set square-shaped in cross-section and partially covers the guide piece 7. According to the preferred embodiment illustrated in FIG. 1A, the fastening ring 8 has the additional advantage of having an upper surface 81 aligned with the outer surface 33 of the pushbutton body 3 such that it forms an extended abutment surface facing the lower peripheral abutment surface 13 of the pushbutton head 1 and controls the travel Cp of the pushbutton corresponding to the vertical distance between the upper surface of the pushbutton head 1 in the resting position Pr and the active position Pa illustrated in FIG. 2 described below. According to the described embodiment this travel of the pushbutton Cp also corresponds to the distance between the two surfaces given the references 13 and 33.

Once the guide piece 7 is fixed, the pushbutton head 1 still remains to be assembled inside this piece. As can be seen in FIG. 1A, the central part 12 of the pushbutton head 1 comprises first and second aligned and vertical side faces 123 and 124 respectively, between which a recess 122 is arranged to accommodate a holding flange 9. Similarly, the guide piece 7 comprises a first inner side face 720 and a second inner side face 724, both aligned and vertical, between which a recess 721 is arranged. In assembled position the holding flange 9 projects slightly laterally of the recess 122 that is enclosed by its upper 1221 and lower 1222 abutment surfaces, between which it is positioned axially in relation to the pushbutton head 1 by means of its upper 91 and lower 92 surfaces, and it is partially accommodated in a recess 721 provided in the guide piece 7. In order to prevent any movement of the holding flange 9 towards the outside of the centrepart 2 and consequently out of the pushbutton head 1, to which it is axially integral, the projecting part of the upper surface 91 of the holding flange 9 located outside the recess of the central part 122 is held in abutment against the retaining surface 722 of the guide piece 7 closing the recess 721 of this piece to the top.

The travel of the pushbutton head 1 is not, however, limited by the lower abutment surface 723 towards the interior of the centrepart 2 because of the oblique side face 93 of the holding flange 9, which can slide over the edge of the recess 721 (i.e. formed by surfaces with the references 723 and 724), while the latter is compressed radially. This arrangement of an outer oblique side face 93 oriented towards the centre for the holding flange 9 also allows it to be easily inserted into the recess of the guide piece 721, because it is guided progressively radially inwards when the pushbutton head 1 is directed towards the interior of the pushbutton body 3 and it comes into contact with the edge formed by the upper surface of the guide piece 74 and the first inner side face 720 of this same guide piece 7. To be able to conduct such an assembly of the pushbutton head, it could be noted that the width of the upper surface of the holding flange 91 should necessarily be less than or equal to the depth of the recess 122 formed in the central part 12 of the pushbutton head 1, such that the inner side face of the holding flange 94 is not in abutment with the base of the recess 122 before sufficient space has been freed to allow passage of the first outer side face of the central part of the pushbutton 123 along the first inner side face of the guide piece 720.

It could also be noted that, according to the illustrated preferred embodiment, the thickness E of the pushbutton as well as the axial positioning of the retaining surface 722 of the guide piece 7 are configured such that in the resting position Pr of the pushbutton head 1 the lower surface 121 of the pushbutton head 1 is in contact with the upper surface 621 of the capsule 60 without the latter being deformed when the upper surface 91 of the holding flange 9 is in contact with the retaining surface 722 of the guide piece 7. The pushbutton head 1 is thus held in this resting position Pr without any axial play, since the capsule 60 exerts a restoring force towards the outside of the centrepart 2, which tends to compress the projecting part of the upper surface 91 of the flange towards the retaining surface 722.

In the preferred embodiment illustrated in FIG. 1A, the spacing e between the fixed contact surface 5 and the movable contact surface 6, i.e. the inner surface of the central part of the capsule 622 at the centre of curvature, is at least 0.3 millimeter in the resting position Pr of the pushbutton in order to better electrically insulate the movable conductive element during immersion of the pushbutton, during the course of which the water can flow to the interior of the holding piece as far as the upper surface 621 of the deformable central part of the capsule 60 and create a parasitic capacitance effect. The increase in minimum distance in the resting position Pr of the pushbutton between the outer surface 53 of the first fixed conductive element 5 and any other conductive element necessarily located beyond the capsule 60 enables these parasitic capacitance effects to be significantly reduced. In order to prevent any untimely activation, an electronic relative variation detection circuit 100 could additionally be used such as that described in patent EP 0838737 of the applicant, which has a detection threshold fixed at more than 5%, knowing that the parasitic capacitance effects corresponding to a detection by touch do not generally exceed 3%. It has been confirmed empirically that the entry of water into the pushbutton according to the invention would not generate a variation in capacitance of more than 2%, so that the above threshold of 5% of relative variation is sufficient to discord these two types of parasitic capacitance.

According to the preferred embodiment described in FIGS. 1A, 1B, 2 and 3 the travel of the pushbutton Cp between the resting position Pr and the first active position Pa (FIG. 2) and the second active position Pa' (FIG. 3) of the pushbutton head 1 is less than or equal to 0.3 millimeter, i.e. less than two times less than for classic mechanical pushbuttons, for which the travel of the pushbutton is generally in the range of between 0.5 and 1 millimeter. It would be impossible to reduce the travel of the classic mechanical pushbuttons without this having an adverse effect on the reliability of the activations, since it is necessary with such pushbuttons to overcome tolerance errors in the positioning of the pieces inside the case, and in particular those responsible for mechanical connections. The accumulation of tolerance errors would make it impossible to decrease the travel to values lower than 0.5 millimetres.

Figure 2:
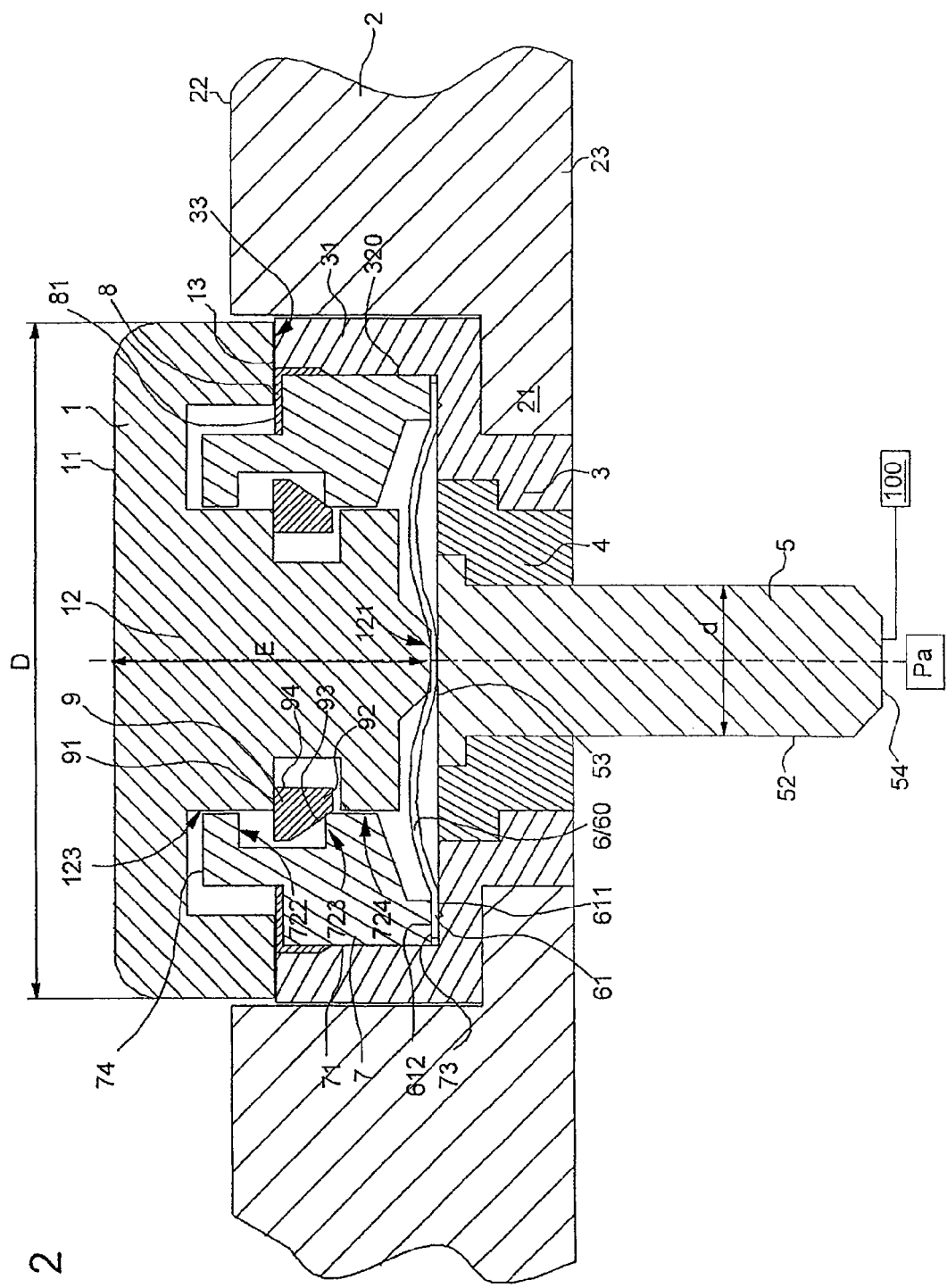
FIG. 2 is a sectional view of the pushbutton according to the preferred embodiment of the invention of the previous FIGS. 1A and 1B in pressed-in position.
Figure 3:
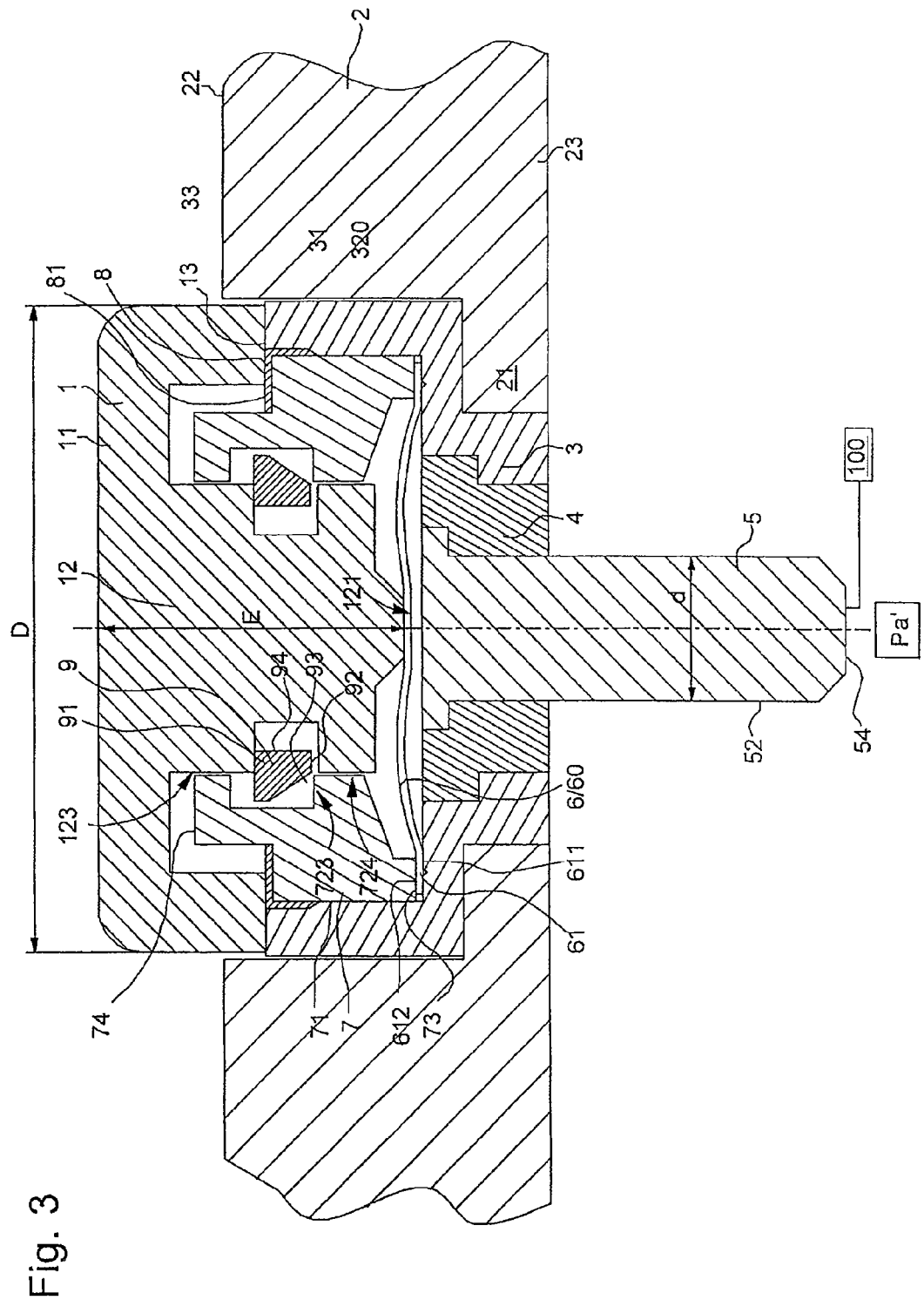
FIG. 3 is a sectional view of a pushbutton according to an alternative embodiment in pressed-in position.

Since the only difference between FIGS. 1A, 2 and 3 is the vertical positioning of the pushbutton head 1, only the elements that change between FIG. 1A and FIGS. 2 and 3 will be described in detail below, the other references being identical in every way to those of FIGS. 1A and 1B.

According to the embodiment illustrated in FIG. 2 showing the pushbutton of FIG. 1A no longer in the resting position Pr, but in a first active position Pa, it can be seen that the spacing e between the outer surface 53 of the first fixed contact element 5 and the lower surface of the central part of the capsule 621, which is metallic here and therefore conductive, is exactly equal to the travel Cp of the pushbutton. However, according to the alternative embodiment illustrated in FIG. 3 showing the pushbutton in a second active position Pa', in which the lower surface of the central part of the capsule 621 is no longer in contact with the outer surface 53 of the first fixed contact element 5, this spacing e is chosen to be slightly larger than the travel of the pushbutton Cp that is determined here by the vertical distance between the peripheral lower surface of the pushbutton head 13 and the upper surface of the pushbutton body 33. Therefore, in all cases we have a travel of the pushbutton that is limited by the spacing e, i.e. the relation Cp≤e, wherein FIG. 2 illustrates the particular case Cp=e, for which it is possible to choose between a capacitive or resistive mode of detection, since the two fixed 5 and movable 6 conductive elements are in physical contact. For the cases where the travel of the pushbutton Cp is strictly smaller than the spacing e, as in the embodiment illustrated in FIG. 3, only the capacitive mode of detection will be possible.

According to the illustrated preferred embodiment the guide piece 7 performs an axial rectilinear guidance for the central part of the pushbutton head 12 towards the interior of the centrepart 2. However, it would be conceivable that the travel of the pushbutton head is curvilinear, e.g. for a pushbutton head 1, in which the upper surface 12 is inclined in relation to the upper surface of the centrepart 22 and pivots around an axis to exert a deformation force onto the capsule 60. Although the travel of the pushbutton Cp is preferably determined by the cooperation between the lower peripheral surface of the pushbutton head 13 and the upper surface of the pushbutton body 33, it would be conceivable that this travel can be determined by other surfaces such as a second lower surface of the pushbutton head 14 coming into abutment against the upper surface of the guide piece 74.

It can be seen in FIGS. 2 and 3 that the curvature of the capsule 60 is inverted; the inversion of this curvature occurs when a force exceeds a mechanical activation threshold. According to a preferred embodiment the curve of the capsule 60, which corresponds to the vertical distance between its top and the peripheral parts, and consequently the spacing e between the contact elements, its diameter, its thickness as well as the rigidity of the material used are configured to determine an activation threshold of less than or equal to 500 grams, and preferably between 400 and 500 grams. This activation threshold is significantly lower than those used in the case of mechanical pushbuttons, for which the presence of thick joints to guarantee the seal in relation to the interior of the case makes activation forces higher than 500 grams essential. In order to facilitate the deformation of the capsule and further reduce the above activation threshold, the lower contact surface of the pushbutton head 121 could be chosen to be as small as possible, as in the illustrated preferred embodiment where it is arranged at the end of a small protruding part below the central part of the pushbutton head 12, which allows maximisation of the pressure exerted on the top of the capsule 60.

The proposed solution has the advantage in relation to an electronic solution of also delivering a mechanical activation confirmation click when the pushbutton head 1 is in active position with a capsule 60 that is either partially deformed as in FIG. 3 or is completely deformed with its lower surface of the central part 622 resting against the upper surface 53 of the first conductive element 5 as in FIG. 2. However, within the framework of the invention the mechanical feedback of an actual activation is obtained not only for a resistive detection such as for pressing keys, for example, but also for a purely capacitive detection.

Thus, the pushbutton according to the described preferred embodiment enables the sealing properties of a totally mechanical solution to be improved significantly while providing the user with a similar ease of use because of the click effect emulating a usual mechanical activation.

Although the described preferred embodiment uses a pushbutton body 3, it will nevertheless be understood that it is also conceivable according to an alternative embodiment that is not illustrated to accommodate the pushbutton directly in the centrepart 2, which allows a saving of one piece, but prevents any modular assembly outside the centrepart and requires machining of appropriate assembly surfaces directly in the centrepart 2.

What is claimed is:

1. A sealed pushbutton for a wristwatch, comprising:
   a pushbutton head that is movable between a resting position and an active position,
   a first fixed conductive element in a case of the wristwatch,
   a second movable conductive element in the case of the wristwatch,
   an elastically deformable capsule that hermetically covers said first fixed conductive element, wherein an upper surface of said capsule is in physical contact with a lower surface of the pushbutton head and said capsule is locatable in a non-deformed position when the pushbutton head is in the resting position and in a deformed position when the pushbutton head is in the active position, and
   a guide piece of said pushbutton head, wherein said guide piece is pressed onto a peripheral part of said capsule, wherein
   said first and second conductive elements form a capacitive switch device in the case of the wristwatch, wherein said switch is in open state when the pushbutton head is in the resting position and in closed state when the pushbutton head is in the active position, and
   an outer surface of said first fixed conductive element is 1 square millimeter at maximum and a spacing between said outer surface of said first fixed conductive element and a surface of the second movable conductive element is at least 0.3 millimeter in said resting position of the pushbutton.

2. The sealed pushbutton according to claim 1, wherein the pushbutton head is axially guided and travel of the pushbutton head between said resting position and the active position is less than or equal to 0.3 millimeter.

3. The sealed pushbutton according to claim 2, wherein the pushbutton head comprises a lower peripheral abutment surface that determines said travel of the pushbutton head.

4. The sealed pushbutton according to claim 2, wherein a spacing between a surface of said first fixed conductive element and a surface of the second movable conductive element is greater than or equal to said travel of the pushbutton.

5. The sealed pushbutton according to claim 1, wherein said capsule is arranged to determine an activation threshold of less than 500 grams and of which a curvature inversion during elastic deformation of the capsule provides a mechanical activation confirmation click when the pushbutton head is in the active position.

6. The sealed pushbutton according to claim 5, wherein a deformable central part of said capsule forms the second movable conductive element.

7. The sealed pushbutton according to claim 6, wherein the peripheral part of said capsule is fixed to an annular pushbutton body separate from a center part of the watch.

8. The sealed pushbutton according to claim 7, wherein said capsule and said pushbutton body are conductive.

9. The sealed pushbutton according to claim 8, wherein the first fixed conductive element is transversal and the pushbutton comprises an annular insulating piece interposed between said first fixed conductive element and said pushbutton body.

10. The sealed pushbutton according to claim 1, wherein the pushbutton comprises a holding flange of said pushbutton head partially accommodated in a recess of a central part of the pushbutton head.

11. The sealed pushbutton according to claim 10, wherein said holding flange has an oblique outer side face.

12. A wristwatch comprising:
    a pushbutton including
       a pushbutton head that is movable between a resting position and an active position,
       a first fixed conductive element in a case of the wristwatch,
       a second movable conductive element in the case of the wristwatch,
       an elastically deformable capsule that hermetically covers said first fixed conductive element, wherein an upper surface of said capsule is in physical contact with a lower surface of the pushbutton head and said capsule is locatable in a non-deformed position when the pushbutton head is in the resting position and in a deformed position when the pushbutton head is in the active position, and
       a guide piece of said pushbutton head, wherein said guide piece is pressed onto a peripheral part of said capsule, wherein
       said first and second conductive elements form a capacitive switch device in the case of the wristwatch, wherein said switch is in open state when the pushbutton head is in the resting position and in closed state when the pushbutton head is in the active position,
       an outer surface of said first fixed conductive element is 1 square millimeter at maximum and a spacing between said outer surface of said first fixed conductive element and a surface of the second movable conductive element is at least 0.3 millimeter in said resting position of the pushbutton, and wherein
       said first fixed conductive element is connected to an electronic detection circuit based on relative impedance variation.

13. The wristwatch according to claim 12, wherein a detection threshold is fixed at more than 5%.

14. The wristwatch according to claim 12, wherein the wristwatch is a waterproof watch.

15. A sealed pushbutton for a wristwatch, comprising:
a pushbutton head that is movable between a resting position and an active position,
a first fixed conductive element in a case of the wristwatch,
a second movable conductive element in the case of the wristwatch,
an elastically deformable capsule that hermetically covers said first fixed conductive element, wherein an upper surface of said capsule is in physical contact with a lower surface of the pushbutton head and said capsule is locatable in a non-deformed position when the pushbutton head is in the resting position and in a deformed position when the pushbutton head is in the active position, and
a guide piece of said pushbutton head, wherein said guide piece is pressed onto a peripheral part of said capsule, wherein
said first and second conductive elements form a capacitive or resistive switch device in the case of the wristwatch, wherein said switch is in open state when the pushbutton head is in the resting position and in closed state when the pushbutton head is in the active position, and
an outer surface of said first fixed conductive element is 1 square millimeter at maximum, a spacing between said outer surface of said first fixed conductive element and a surface of the second movable conductive element is at least 0.3 millimeter in said resting position of the pushbutton, and the pushbutton head is axially guided and travel of the pushbutton head between said resting position and the active position is less than or equal to 0.3 millimeter.

* * * * *